United States Patent [19]

Suppelsa et al.

[11] Patent Number: 5,280,139
[45] Date of Patent: Jan. 18, 1994

[54] SELECTIVELY RELEASING CONDUCTIVE RUNNER AND SUBSTRATE ASSEMBLY

[75] Inventors: Anthony B. Suppelsa, Coral Springs; William B. Mullen, III, Boca Raton; Glenn F. Urbish, Coral Springs, all of Fla.

[73] Assignee: Motorola, Inc., Schaumburg, Ill.

[21] Appl. No.: 930,498

[22] Filed: Aug. 17, 1992

Related U.S. Application Data

[63] Continuation of Ser. No. 486,999, Mar. 1, 1990.

[51] Int. Cl.⁵ .............................................. H05K 1/00
[52] U.S. Cl. .................................... 174/260; 174/259; 361/774; 361/779
[58] Field of Search ............... 174/254, 256, 259, 260; 361/406, 411

[56] References Cited

U.S. PATENT DOCUMENTS

| | | | |
|---|---|---|---|
| 3,487,541 | 1/1970 | Boswell | 174/260 |
| 3,689,991 | 9/1972 | Aird . | |
| 3,932,689 | 1/1976 | Watanabe | 174/259 |
| 4,728,751 | 3/1988 | Canestaro et al. | 361/406 X |
| 5,121,298 | 6/1992 | Sarma et al. | 361/411 X |

Primary Examiner—Lincoln Donovan
Assistant Examiner—Cheryl R. Figlin
Attorney, Agent, or Firm—Dale W. Dorinski; Pablo Meles

[57] ABSTRACT

A selectively releasing runner and substrate assembly 10 comprises a plurality of conductive runners 16 adhered to a substrate 12, a portion 18 of at least some of the conductive runners 16 have a lower adhesion to the substrate for selectively releasing the conductive runner from the substrate when subjected to a predetermined stress.

10 Claims, 3 Drawing Sheets

SELECTIVELY RELEASING CONDUCTIVE RUNNER AND SUBSTRATE ASSEMBLY

This is a continuation of application Ser. No. 07/486,999, filed Mar. 1, 1990 and now abandoned.

TECHNICAL FIELD

This invention relates generally to the field of substrate and runner assemblies, and more specifically to a method of directly attaching an electronic component such as a semiconductor die to a substrate while reducing the stresses associated with the metallization interconnections between the substrate and the electronic component.

BACKGROUND

Direct die attachment to a substrate such as a molded printed wiring board, a printed wiring board, or a flexible circuit board is known in the art, but is rarely used because of the poor reliability associated with the Thermal Coefficient of Expansion (TCE) mismatch between the die and substrate. The TCE mismatch causes the solder interconnect to eventually crack or otherwise remove the integral connections between the die and the substrate. For example, a silicon die has a TCE of 4.6 while a glass filled printed wiring board has a TCE that ranges from 8 to 45. Temperature fluctuations will cause the die to expand and contract at a different rate than the printed wiring board, thereby causing catastrophic stresses in the die interconnect metallizations. Therefore, a need exists for a method of directly attaching a die to a substrate that overcomes the problems resulting from different coefficients of expansion for the substrate and die.

SUMMARY OF THE INVENTION

Accordingly, it is an object of the present invention to design an interconnection assembly that will yield with stress instead of fracturing under stress, preventing a mechanical or electrical failure.

Briefly, according to the invention, a selectively releasing runner and substrate assembly has low stress interconnect metallization for direct component attachment to metallized conductive runners on a substrate that will self-release under an applied stress. The metallized conductive runners minimize stress transmitted to the interconnection between the runners and the die by selectively releasing from portions of the substrate while maintaining the interconnection between the die and the runners.

DETAILED DESCRIPTION OF THE PREFERRED EMBODIMENT

Figure 1:
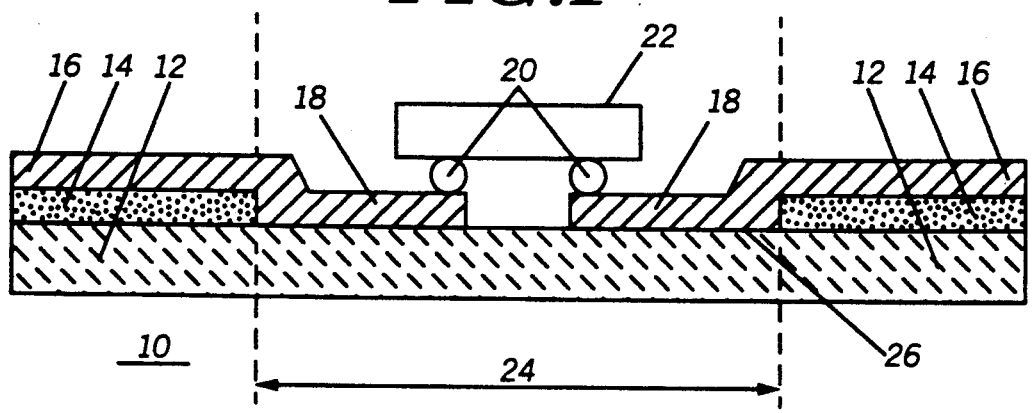
FIG. 1 is a cross sectional view of a selectively releasing runner and substrate assembly (unaffected by stress) in accordance with the present invention.

Referring to FIG. 1, there is shown a cross-sectional view of the selectively releasing runner and substrate assembly 10 in accordance with the present invention. A metal adhesive layer 14 such as chromium, nichrome, nickel, or titanium is deposited on a substrate 12 for providing maximum adhesion between the substrate 12 and a conductive runner 16. The conductive runner 16 has portions 18 wherein the conductive runner directly attaches to the substrate 12, thereby providing minimal adhesion to the substrate 12.

Figure 2:
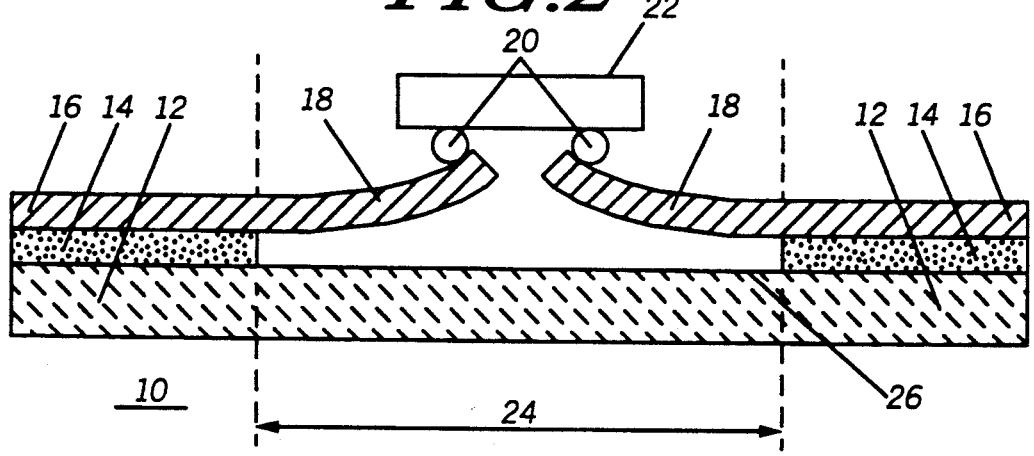
FIG. 2 is a cross sectional view of the selectively releasing runner and substrate assembly of FIG. 1 (affected by stress).

The conductive runner (16) has its own adhesive properties as is known in the art that allow it to have "minimal" adhesion to the substrate (12) without an extra adhesive layer 14. The use of the adhesive layer 14 provides greater or "maximum" adhesion between the substrate 14 and the conductive runner 16. More specifically, the normal metallization process for "maximum" adhesion for sputter deposition of an adhesive metal layer (such as Nichrome, Chromium or Titanium, plus Copper) onto an organic substrate, (PC board or Kapton) will yield a pull and peel strength initially (prior to peel) of approximately 8 lbs./in.-w (pounds per inch width). The running peel strength for the same configuration is approximately 6 lbs./in.-w. If no adhesion layer is used (i.e., no Nichrome, Chromium, or Titanium used) then the "minimal" adhesion pull/peel strength for an initial pull to initiate a peel is approximately 2 lbs./in-w. The running peel strength of sputtered copper without the adhesive layer is 0.5 lbs./in-w. The stress release zone 24 is located adjacent to the area the conductive runner portion 18 directly attaches to the substrate. An electronic component 22 such a semiconductor die or chip carrier is mechanically and electrically attached to the selectively releasable conductive runner portion 18 by using the solder 20. Referring to FIG. 2, the conductive runner portion 18 releases from the substrate 12 in the area of the stress release zone 24 while maintaining maximum adhesion in the remainder of the conductive runner 16 where the adhesive 14 couples it to the substrate 12.

Figure 3A:
FIG. 3A through 3H are cross-sectional views of the steps for manufacturing a selectively releasing runner and substrate assembly in accordance the present invention.
Figure 3B:
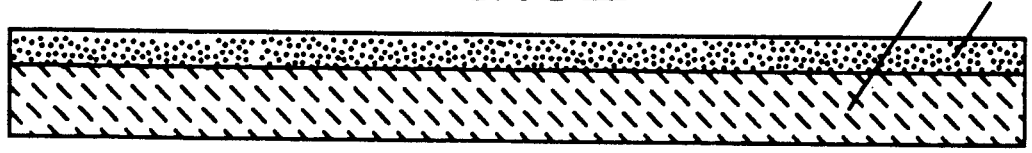
Figure 3C:
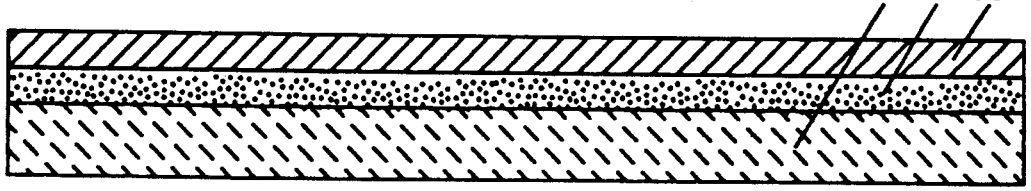

Referring to FIGS. 3A-H, the steps or process for manufacture of a selectively releasing runner and substrate assembly 30 are illustrated. A substrate 32, preferably comprised of ceramic, flexible circuitry, printed wiring board, or molded printed wiring board is provided. The ceramic is typically alumina, steatite, aluminum nitride, or barium titanate. The flexible circuitry is typically comprised of polyimide or polyester film that are sold by Dupont with the names Kapton ® or Mylar ® respectively. The printed wiring boards are typically comprised of polyimide, FR4 (a flame retardant resin), BT or Cyanate-Ester. The molded printed wiring board is typically comprised of filled or unfilled polyetherimide material sold by General Electric with the name of ULTEM ®. The substrate 32 provided in FIG. 3A is preferably cleaned by first using hot detergent and water, and then by plasma cleaning. In FIG. 3B, an adhesion layer 34 of metal such as chromium, titanium, nichrome, or nickel is preferably sputter deposited or vacuum deposited onto the substrate 32. In FIG. 3C, a metal layer 36, typically copper, is preferably sputter deposited over the adhesion layer 34, creating maximum bonding between the metal layer 36 and the substrate 32.

Figure 3D:
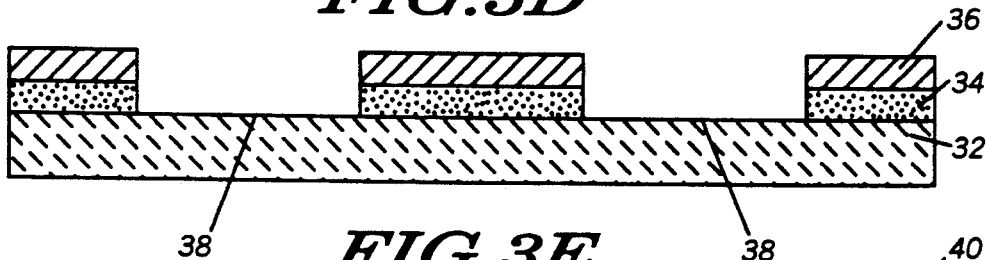
Figure 3E:
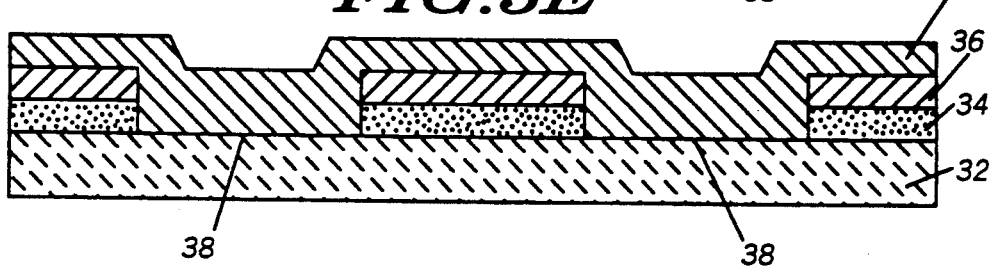
Figure 3F:
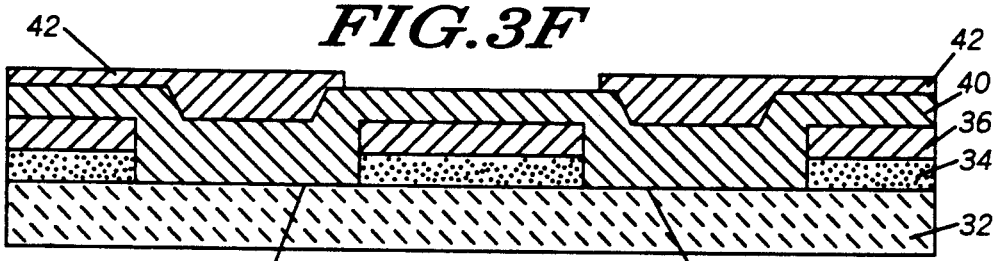
Figure 3G:
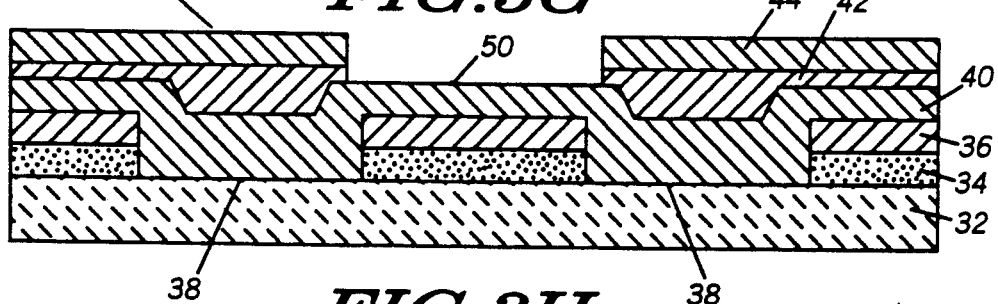
Figure 3H:
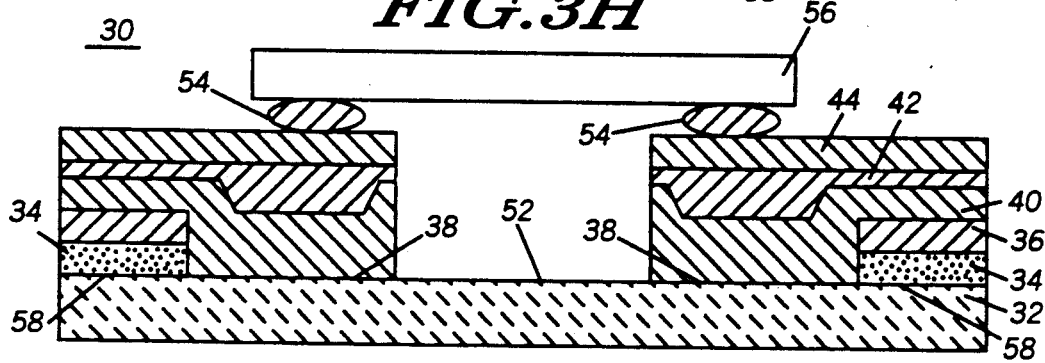

In FIG. 3D, the areas (38) requiring minimal adhesive strength on the runner and substrate assembly 30 are defined (preferably by using photoresist) and removed by using any of the well known methods including chemical etching, sputter etching, reactive ion etching, or ion beam milling. The areas 38 expose the bare substrate after the removal of portions of the metal adhesive 34 and the metal layer 36. In FIG. 3E, the photoresist is removed and then another layer of metal 40, preferably copper, is sputtered over the entire substrate including areas 38 where the substrate 32 was exposed. In FIG. 3F, areas where the metal runners are desired are defined or delineated, preferably using photoresist techniques. Furthermore, the areas delineated for metal runners are electroplated with metal, preferably copper forming layer 42. In FIG. 3G, the electroplated layer 42 is over plated with nickel and gold indicated by layer 44. In FIG. 3H, the photoresist used in FIG. 3F is removed, and the areas 50 that were not electroplated or overplated are preferably etched back to the substrate, exposing area 52 of the substrate 32. Finally solder 54 is applied to the top surface of the metal runners (44) in order to mechanically and electrically attach an electronic component such as a die 56 or a ceramic chip carrier.

If the selectively releasing runner and substrate assembly 30 is subjected to stresses associated with the different temperature coefficients of expansion, then the portions of the metal runners on the areas 38 on the substrate 32 (where minimal adhesion is desired) will release from the substrate 32. Meanwhile, the areas 58 (where maximum adhesion is desired) having the adhesion layer 34 does not release the portions of the metal runners bonded above the adhesion layer 34.

Figure 4:
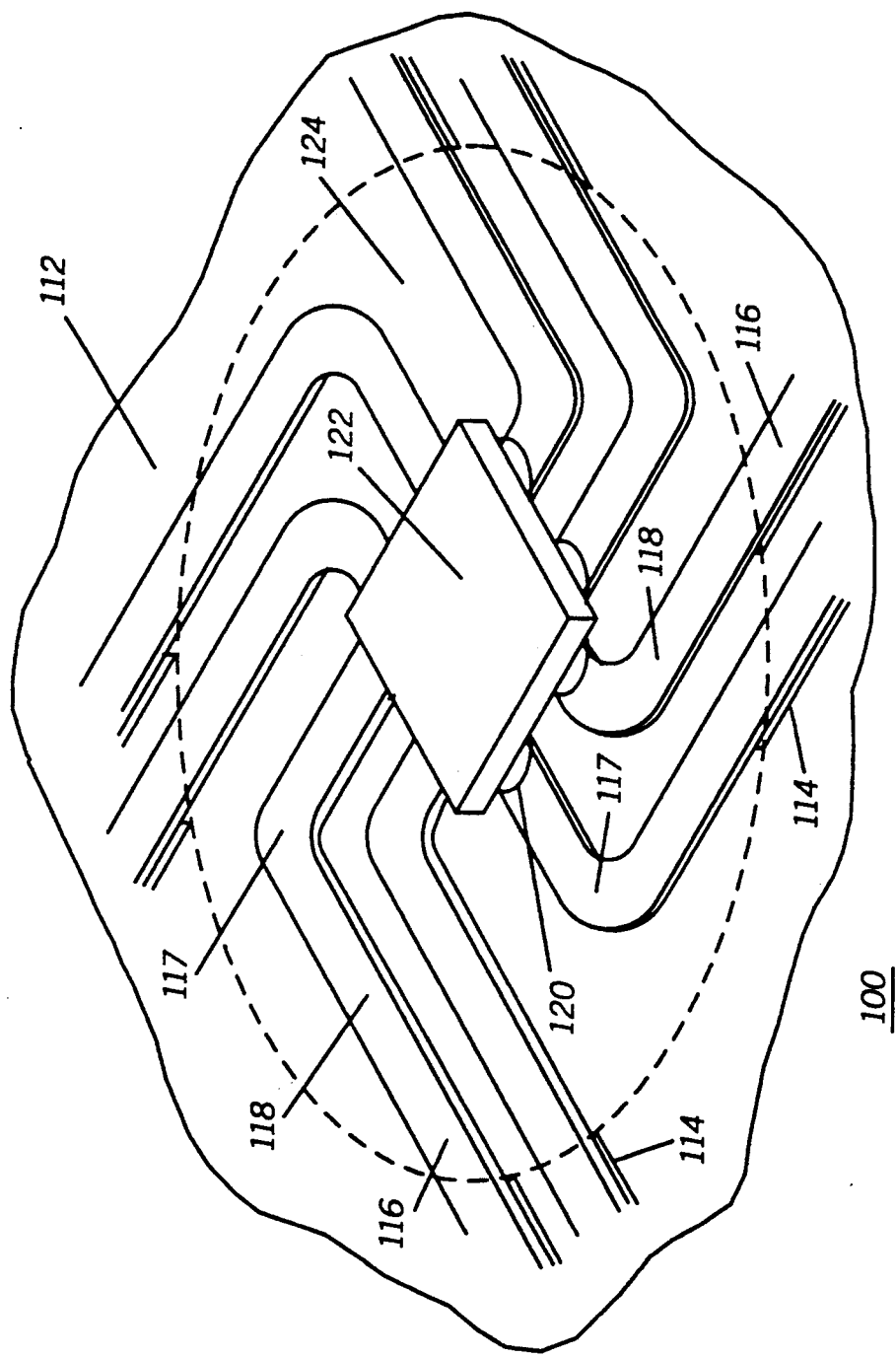
FIG. 4 is a top plan view of the selectively releasing runner and substrate assembly in accordance with the present invention.

Referring to FIG. 4, a top plan view of a selectively releasing runner and substrate assembly 100 is shown in accordance with the present invention. A metal adhesive layer 114 such as chromium, nichrome, nickel, or titanium is selectively deposited on a substrate 112 for providing maximum adhesion between the substrate 112 and conductive runners 116. The conductive runners 116 have portions 118 where (24) the conductive runner directly attaches to the substrate 112, thereby providing minimal adhesion to the substrate 112. An electronic component 122 such as a die or chip carrier attaches to the selectively releasable conductive runner portions 118 as by the use of the solder 120. The stress release zone 124 is located below the conductive runner portions 118 which directly attach to the substrate 112. The conductive runner portions 118 release from the substrate 112 in the area of the stress release zone 124 while maintaining maximum adhesion in the remainder of the conductive runner 116 where the adhesive 114 couples it to the substrate 112. In this particular depiction of the selectively releasing conductive runner and substrate assembly 100, the use of a bend 117 in each of the conductive runners (116) allows the conductive runner portions (118) released from the substrate to relieve stress due to differences in the thermal expansion rates of the substrate and runners by twisting or buckling at the bend 117.

What is claimed is:

1. A substrate assembly having selectively releasing connections, comprising:
    an insulating substrate comprising a material selected from the group consisting of epoxy, polyimide, flame retardant-4, benzo-triazene, Cyanate-Ester, polyester, unfilled polyetherimide, filled polyetherimide, and ceramic;
    an adhesive layer, consisting of a metal layer vacuum deposited on portions of the substrate, the metal selected from the group consisting of chrome, nichrome, nickel, and titanium;
    a conductive layer, consisting of vacuum deposited copper on at least portions of the adhesive layer and on portions of the bare substrate, wherein the portions of conductive layer on the adhesive layer provides maximum adhesion between the conductive layer and the substrate and wherein the portions of the conductive layer on the bare substrate provides minimum adhesion between the conductive layer and the substrate.

2. The assembly of claim 1, wherein the insulating substrate comprises a polyimide film.

3. The assembly of claim 1, wherein the insulating substrate comprises a polyester film.

4. The assembly of claim 1, wherein an electronic component is attached to the portion of the conductive runners having a lower adhesion to the substrate.

5. The assembly of claim 4, wherein the electronic component comprises a semiconductor die.

6. The assembly of claim 1, wherein a chip carrier is coupled to the portion of the selectively releasing connections having a lower adhesion to the substrate.

7. The assembly of claim 1, wherein the substrate comprises a flexible circuit.

8. The assembly of claim 1, wherein said connections, having radially bending features, directly attach to the substrate and further include a portion of said connections with maximum adhesion to the substrate that will remain attached to the substrate when stress is applied.

9. A substrate assembly having selectively releasing runners, comprising:
    a substrate;
    a plurality of conductive runners having a first layer consisting of vacuum deposited copper adhered to the substrate, a selected portion of at least some of said runners having lower adhesion to the substrate than a remaining portion of said conductive runners, that will selectively release the runner from the substrate when a predetermined stress is applied to said assembly;
    an adhesion layer on the substrate, consisting of chrome vacuum deposited on the substrate, residing below the remaining portion of the conductive runners where the runners do not selectively release when the predetermined stress is applied to said assembly.

10. The substrate assembly of claim 9, wherein said conductive runners, having radially bending features, directly attach to the substrate and further include a portion of said runners with maximum adhesion to the substrate that will remain attached to the substrate when stress is applied.

* * * * *